(12) United States Patent
Tsutsui et al.

(10) Patent No.: US 7,511,421 B2
(45) Date of Patent: Mar. 31, 2009

(54) MIXED METAL AND ORGANIC ELECTRODE FOR ORGANIC DEVICE

(75) Inventors: Tetsuo Tsutsui, Fukuoka (JP); Daisuke Kumaki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/919,333

(22) Filed: Aug. 17, 2004

(65) Prior Publication Data

US 2005/0134173 A1 Jun. 23, 2005

(30) Foreign Application Priority Data

Aug. 25, 2003 (JP) .............................. 2003-299441

(51) Int. Cl.
*H05B 33/04* (2006.01)
*H01L 51/50* (2006.01)

(52) U.S. Cl. ..................................... 313/506

(58) Field of Classification Search ......... 313/498–512; 428/690
See application file for complete search history.

(56) References Cited

U.S. PATENT DOCUMENTS

| | | | |
|---|---|---|---|
| 4,552,927 A | 11/1985 | Warren | |
| 4,741,976 A | 5/1988 | Eguchi et al. | |
| 4,871,236 A | 10/1989 | Gemma et al. | |
| 4,913,744 A | 4/1990 | Hoegl et al. | |
| 4,971,919 A | 11/1990 | Yamazaki | |
| 5,229,310 A | 7/1993 | Sivan | |
| 5,294,870 A | 3/1994 | Tang et al. | |
| 5,364,654 A | 11/1994 | Hosokawa et al. | |
| 5,454,880 A | 10/1995 | Sariciftci et al. | |
| 5,458,977 A | 10/1995 | Hosokawa et al. | |
| 5,478,777 A | 12/1995 | Yamazaki | |
| 5,500,537 A | 3/1996 | Tsumura et al. | |
| 5,648,181 A | 7/1997 | Watanabe | |

(Continued)

FOREIGN PATENT DOCUMENTS

EP 0 461 542 12/1991

(Continued)

OTHER PUBLICATIONS

Pending U.S. Appl. No. 10/919,334, filed Aug. 17, 2004, Tsutsui et al.

(Continued)

*Primary Examiner*—Nimeshkumar D. Patel
*Assistant Examiner*—Anne M Hines
(74) *Attorney, Agent, or Firm*—Fish & Richardson P.C.

(57) ABSTRACT

To provide an electrode for an organic device which can be widely applied to organic devices by having both hole injection function and electron injection function. A carrier injection electrode layer 110 in which a metal for electron injection 112 (a metal having a work function of 4.2 eV or less) and a metal for hole injection 113 (a metal having a work function of more than 4.2 eV) are mixed with one kind of organic compound 111 is provided between a first organic layer 100*a* and a second organic layer 100*b*. Thus, carriers are injected into a carrier injection electrode layer 110 in the direction according to voltage application, and seemingly, current flows between an organic layer 100 and a metal electrode 101, or between the first organic layer 100*a* and the second organic layer 100*b*.

10 Claims, 5 Drawing Sheets

U.S. PATENT DOCUMENTS

| | | | |
|---|---|---|---|
| 5,677,546 | A | 10/1997 | Yu |
| 5,682,043 | A | 10/1997 | Pei et al. |
| 5,684,320 | A | 11/1997 | Kawashima |
| 5,757,139 | A * | 5/1998 | Forrest et al. ............ 315/169.3 |
| 5,821,690 | A | 10/1998 | Martens et al. |
| 5,837,391 | A | 11/1998 | Utsugi |
| 5,858,561 | A | 1/1999 | Epstein et al. |
| 5,917,280 | A | 6/1999 | Burrows et al. |
| 5,955,835 | A | 9/1999 | Oh et al. |
| 5,965,063 | A | 10/1999 | Agata et al. |
| 5,970,318 | A | 10/1999 | Choi et al. |
| 5,982,345 | A | 11/1999 | Takayama et al. |
| 6,013,384 | A | 1/2000 | Kido et al. |
| 6,107,734 | A | 8/2000 | Tanaka et al. |
| 6,198,091 | B1 | 3/2001 | Forrest et al. |
| 6,198,092 | B1 | 3/2001 | Bulovic et al. |
| 6,255,774 | B1 | 7/2001 | Pichler |
| 6,278,055 | B1 | 8/2001 | Forrest et al. |
| 6,297,495 | B1 | 10/2001 | Bulovic et al. |
| 6,300,612 | B1 | 10/2001 | Yu |
| 6,337,492 | B1 | 1/2002 | Jones et al. |
| 6,340,789 | B1 | 1/2002 | Petritsch et al. |
| 6,352,777 | B1 | 3/2002 | Bulovic et al. |
| 6,403,392 | B1 | 6/2002 | Burrows et al. |
| 6,414,432 | B1 | 7/2002 | Hieda et al. |
| 6,423,429 | B2 | 7/2002 | Kido et al. |
| 6,451,415 | B1 | 9/2002 | Forrest et al. |
| 6,452,092 | B2 | 9/2002 | Han et al. |
| 6,483,123 | B1 | 11/2002 | Kim et al. |
| 6,486,601 | B1 | 11/2002 | Sakai et al. |
| 6,524,884 | B1 | 2/2003 | Kim et al. |
| 6,559,375 | B1 | 5/2003 | Meissner et al. |
| 6,580,027 | B2 | 6/2003 | Forrest et al. |
| 6,580,213 | B2 | 6/2003 | Yamazaki |
| 6,614,176 | B2 | 9/2003 | Kim et al. |
| 6,651,871 | B2 | 11/2003 | Ogure |
| 6,657,378 | B2 | 12/2003 | Forrest et al. |
| 6,692,820 | B2 | 2/2004 | Forrest et al. |
| 6,717,358 | B1 | 4/2004 | Liao et al. |
| 6,740,938 | B2 | 5/2004 | Tsunoda et al. |
| 6,759,145 | B2 | 7/2004 | Lin et al. |
| 6,812,399 | B2 | 11/2004 | Shaheen et al. |
| 6,844,025 | B2 | 1/2005 | Forrest et al. |
| 6,872,472 | B2 | 3/2005 | Liao et al. |
| 6,876,007 | B2 | 4/2005 | Yamazaki et al. |
| 6,914,272 | B2 * | 7/2005 | Goetz et al. ............. 257/123 |
| 7,199,521 | B2 | 4/2007 | Ibe |
| 7,239,081 | B2 | 7/2007 | Tsutsui |
| 7,291,969 | B2 | 11/2007 | Tsutsui |
| 7,420,203 | B2 | 9/2008 | Tsutsui et al. |
| 2001/0031509 | A1 | 10/2001 | Yamazaki |
| 2001/0046611 | A1 | 11/2001 | Kido et al. |
| 2002/0028347 | A1 | 3/2002 | Marrocco III et al. |
| 2002/0074935 | A1 | 6/2002 | Kwong et al. |
| 2002/0119297 | A1 | 8/2002 | Forrest et al. |
| 2002/0173068 | A1 | 11/2002 | Kido et al. |
| 2002/0180349 | A1 * | 12/2002 | Aziz et al. ............. 313/506 |
| 2002/0197462 | A1 | 12/2002 | Forrest et al. |
| 2003/0025166 | A1 | 2/2003 | Yamazaki et al. |
| 2003/0094612 | A1 | 5/2003 | Yamazaki et al. |
| 2003/0127967 | A1 | 7/2003 | Tsutsui et al. |
| 2003/0159729 | A1 | 8/2003 | Shaheen et al. |
| 2003/0170491 | A1 * | 9/2003 | Liao et al. ............. 428/690 |
| 2003/0189401 | A1 | 10/2003 | Kido et al. |
| 2003/0209974 | A1 | 11/2003 | Yamazaki |
| 2003/0218166 | A1 | 11/2003 | Tsutsui |
| 2004/0027059 | A1 | 2/2004 | Tsutsui |
| 2004/0027061 | A1 | 2/2004 | Seo et al. |
| 2004/0113546 | A1 | 6/2004 | Forrest et al. |
| 2004/0123804 | A1 | 7/2004 | Yamazaki et al. |
| 2004/0124505 | A1 | 7/2004 | Mahle et al. |
| 2004/0139914 | A1 | 7/2004 | Yamazaki et al. |
| 2004/0150333 | A1 | 8/2004 | Tsutsui |
| 2004/0151887 | A1 | 8/2004 | Forrest et al. |
| 2004/0245541 | A1 | 12/2004 | Shitagaki et al. |
| 2004/0256620 | A1 | 12/2004 | Yamazaki et al. |
| 2005/0012456 | A1* | 1/2005 | Nakatsu et al. ............. 313/506 |
| 2005/0023522 | A1 | 2/2005 | Frey et al. |
| 2005/0029933 | A1 | 2/2005 | Liao et al. |
| 2005/0133783 | A1 | 6/2005 | Yamazaki et al. |
| 2005/0156197 | A1 | 7/2005 | Tsutsui et al. |
| 2006/0091797 | A1 | 5/2006 | Tsutsui et al. |
| 2007/0007538 | A1 | 1/2007 | Ono et al. |

FOREIGN PATENT DOCUMENTS

| | | |
|---|---|---|
| EP | 0 855 848 | 7/1998 |
| EP | 0 855 848 A2 | 7/1998 |
| EP | 1 315 208 | 5/2003 |
| EP | 1 388 904 | 2/2004 |
| EP | 1388903 | 2/2004 |
| EP | 1 408 563 | 4/2004 |
| JP | 55-140277 | 11/1980 |
| JP | 60-028278 | 2/1985 |
| JP | 04-192376 | 7/1992 |
| JP | 04-230997 | 8/1992 |
| JP | 06-188074 | 7/1994 |
| JP | 06-260286 | 9/1994 |
| JP | 06-318725 | 11/1994 |
| JP | 08-288069 | 11/1996 |
| JP | 10-270171 | 10/1998 |
| JP | 11-015408 | 1/1999 |
| JP | 11-162646 | 6/1999 |
| JP | 11-283750 | 10/1999 |
| JP | 11-329749 | 11/1999 |
| JP | 2000-260572 | 9/2000 |
| JP | 2000-306676 | 11/2000 |
| JP | 2000-315581 | 11/2000 |
| JP | 2001-244074 | 9/2001 |
| JP | 2001-357975 | 12/2001 |
| JP | 2002-033193 | 1/2002 |
| JP | 2002-164170 | 6/2002 |
| JP | 2003-045676 | 2/2003 |
| JP | 2003-157983 | 5/2003 |
| JP | 2003-264085 | 9/2003 |
| JP | 2004-095546 | 3/2004 |
| JP | 2004-111085 | 4/2004 |
| JP | 2004-281371 | 10/2004 |
| WO | WO00-01203 | 1/2000 |

OTHER PUBLICATIONS

International Search Report (Application No. PCT/JP2004/012440) in Japanese, Dec. 28, 2004, 7 pages.

International Written Opinion (Application No. PCT/JP2004/012440) in Japanese, Dec. 28, 2004, 5 pages.

International Written Opinion (Application No. PCT/JP2004/012440; PCT7210); partial translation; pp. 1-2; Dec. 28, 2004.

Kido et al., 49th Japan Society of Applied Physics and Related Societies "High Quantum Efficiency Organic EL Devices Having Charge Generation Layer", p. 1308, 27P-YL-3 (2 total pages).

Hung et al. "Enhanced Electron Injection in Organic Electroluminescence Devices Using an AL/LIF Electrode", Applied Physics Letters, vol. 70 , No. 2 , Jan. 13, 1997, pp. 152-154.

T. Tsutsui, "Mechanism of Organic EL Element and Luminous Efficiency," Textbook of The 3rd Seminar at Division of Organic Molecular Electronics and Bioelectronics, 1993, pp. 31-37, The Japan Society of Applied Physics (Full English Translation).

Tang C. et al., "Organic electroluminescent diodes," Appl. Phys. Lett. (Applied Physics Letters), Sep. 21, 1987, vol. 51, No. 12, pp. 913-915 (In English).

Parthasarathy G. et al., "A metal-free cathode for organic semiconductor devices," Appl. Phys. Lett. (Applied Physics Letters), Apr. 27, 1998, vol. 72, No. 17, pp. 2138-2140 (In English).

Shirakawa H. et al., "Synthesis of Electrically Conducting Organic Polymers: Halogen Derivatives of Polyacetylene, (CH)X,", J.C.S. Chem. Comm. (Journal of the Chemical Society. Chemical Communications), 1977, No. 16, pp. 578-580 (In English).

Tang C., "Two-layer organic photovoltaic cell," Appl. Phys. Lett. (Applied Physics Letters), Jan. 13, 1986, vol. 48, No. 2, pp. 183-185 (In English).

Y. Sato, "Problem for Implementation in view of Materials Development," The Japan Society of Applied Physics, Organic Molecular Electronics and Bioelectronics, 2000, vol. 11, No. 1, pp. 86-99 (Partial English Translation).

Hiramoto M. et al., "Effect of Thin Gold Interstitial-layer on the Photovoltaic Properties of Tandem Organic Solar Cell," Chemistry Letters, 1990, pp. 327-330 (In English).

Fuchigami H. et al., "Polythienylenevinylene thin-film transistor with high carrier mobility," Appl. Phys. Lett. (Applied Physics Letters), Sep. 6, 1993, vol. 63, No. 10, pp. 1372-1374 (In English).

Gundlach D. et al., "Pentacene Organic Thin-Film Transistors-Molecular Ordering and Mobility," IEEE Electron Device Letters, Mar. 1, 1997, vol. 18, No. 3, pp. 87-89 (In English).

Narayan K. et al., "Light Responsive Polymer Field-Effect Transistor," Appl. Phys. Lett. (Applied Physics Letters), Sep. 17, 2001, vol. 79, No. 12, pp. 1891-1893 (In English).

Ferraris J., "Electron Transfer in a New Highly Conducting Donor-Acceptor Complex," J. Am. Chem. Soc. (Journal of The American Chemical Society), Feb. 7, 1973, vol. 95, No. 3, pp. 948-949, (In English).

"State of Generation of a pair of electron-hole" and "non-Ohmic contact", (Full English Transllation).

"State of Generation of a pair of electron-hole" and "Ohmic contact", (Full English Translation).

L.S. Liao et al., "High-efficiency tandem organic light-emitting diodes," Appl. Phys. Lett. (Applied Physics Letters), Jan. 12, 2004, vol. 84, No. 2, pp. 167-169 (In English).

G. Yu et al., "Charge separation and photovoltaic conversion in polymer composites with internal donor/acceptor heterojunctions," J. Appl. Phys. (Journal Of Applied Physics), Oct. 1, 1995, vol. 78, No. 7, pp. 4510-4515 (In English).

J. H. Schon et al., "Ambipolar Pentacene Field-Effect Transistors and Inverters," Science, vol. 287, pp. 1022-1023 (In English).

C. H. Chen et al., "Recent Developments In Molecular Organic Electroluminescent Materials," Macromol. Symp. (Macromolecular Symposia), 1997, vol. 125, pp. 1-48 (In English).

B. Ruhstaller et al., "Bias-tuned reduction of self-absorption in polymer blend electroluminescence," Chemical Physics Letters, Feb. 4, 2000, vol. 317, pp. 238-244 (In English).

* cited by examiner

[Fig. 1]
(a)
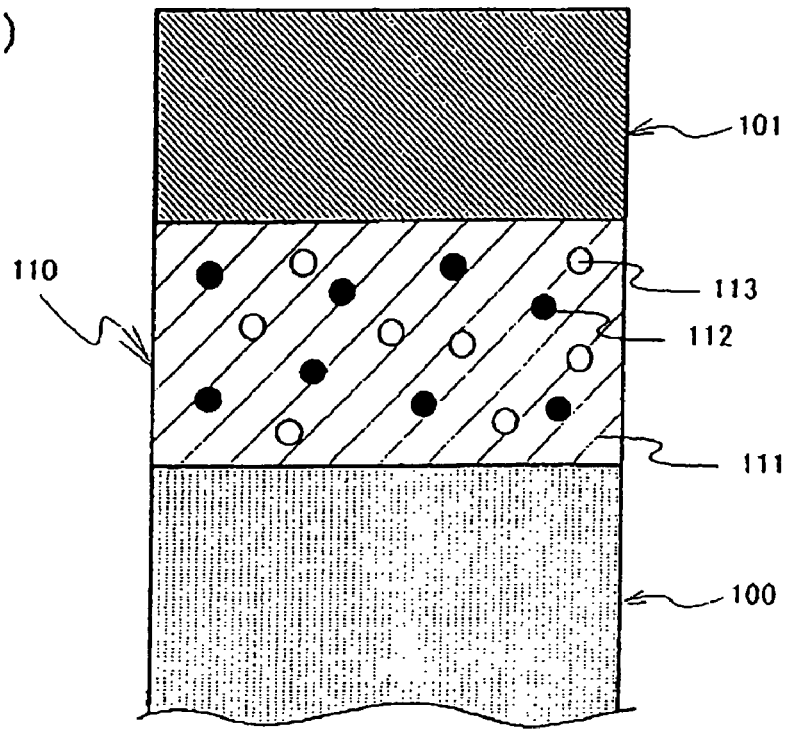
(b)
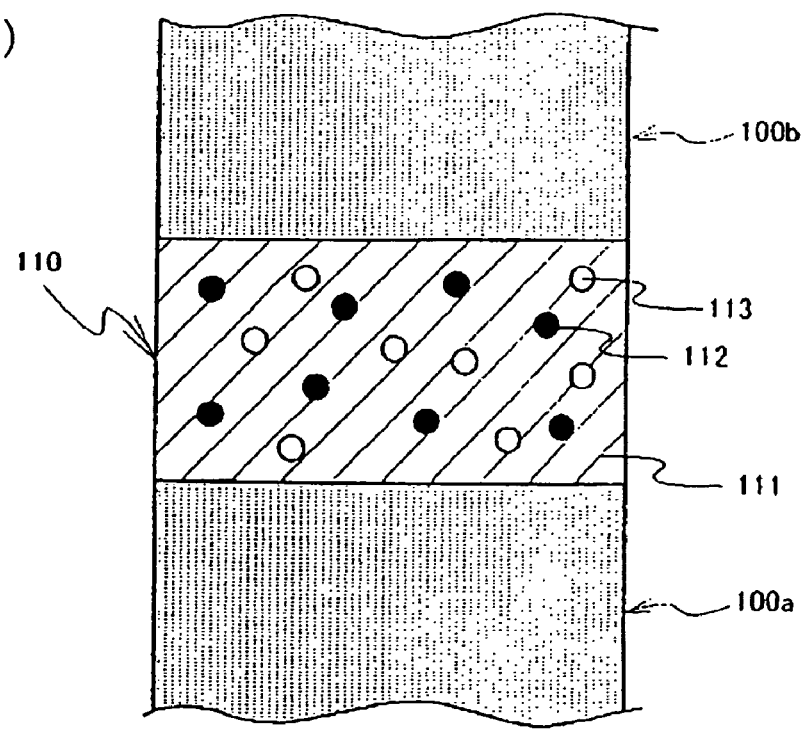

[Fig.2]
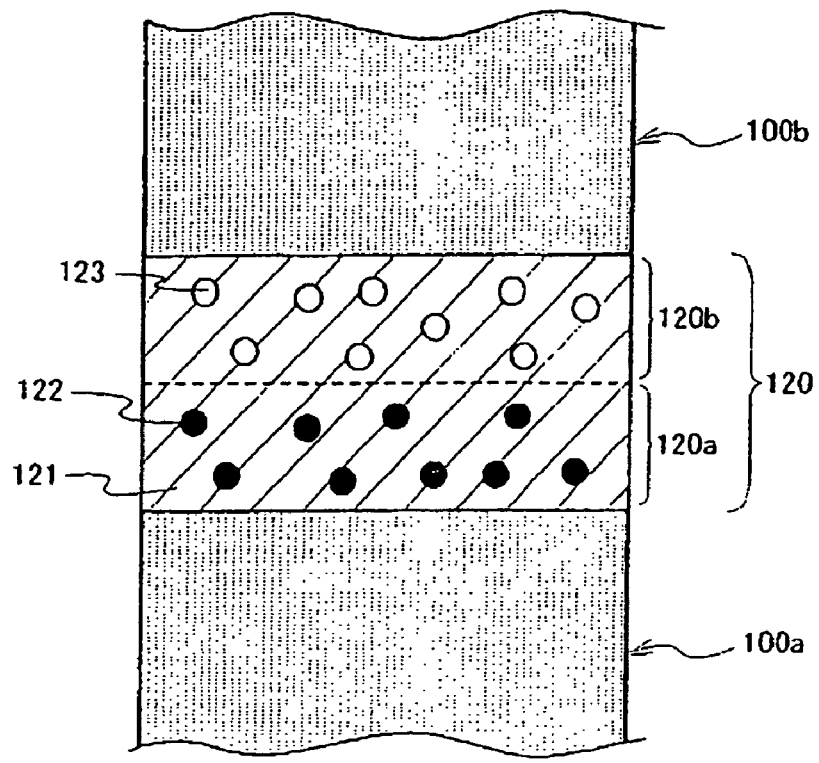
[Fig.3]
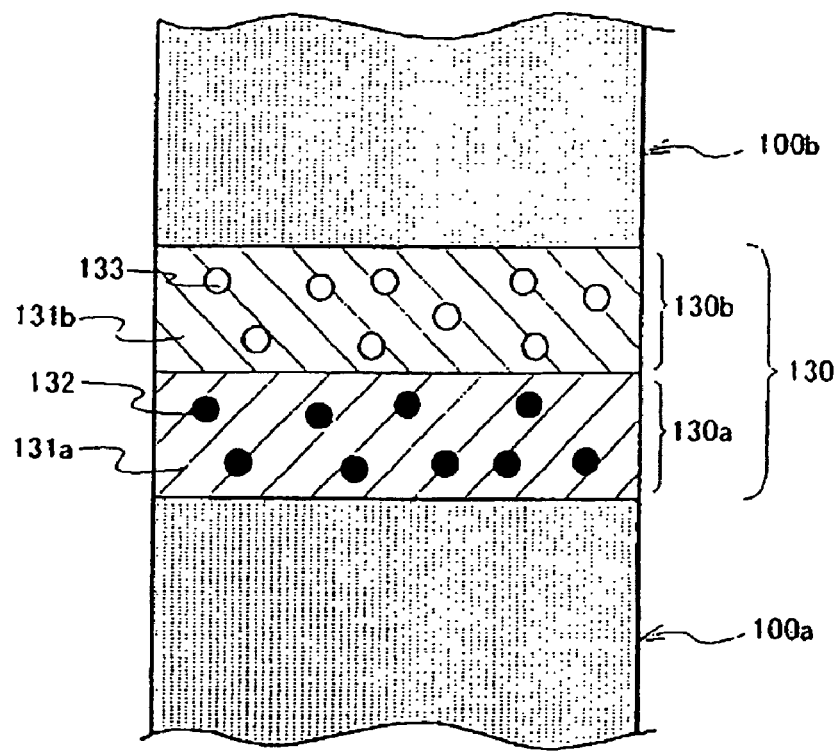

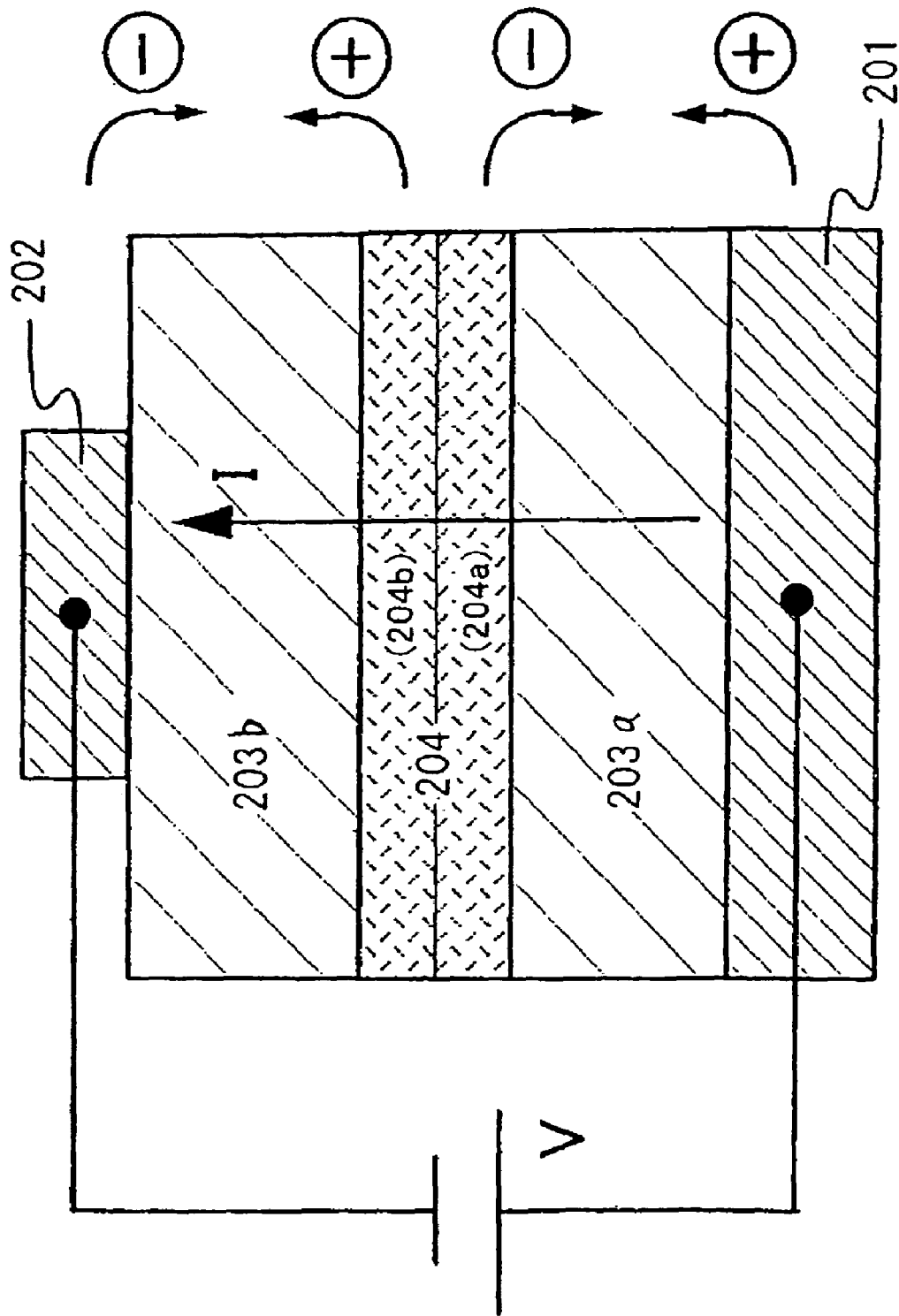
[Fig.4]

[Fig. 5]
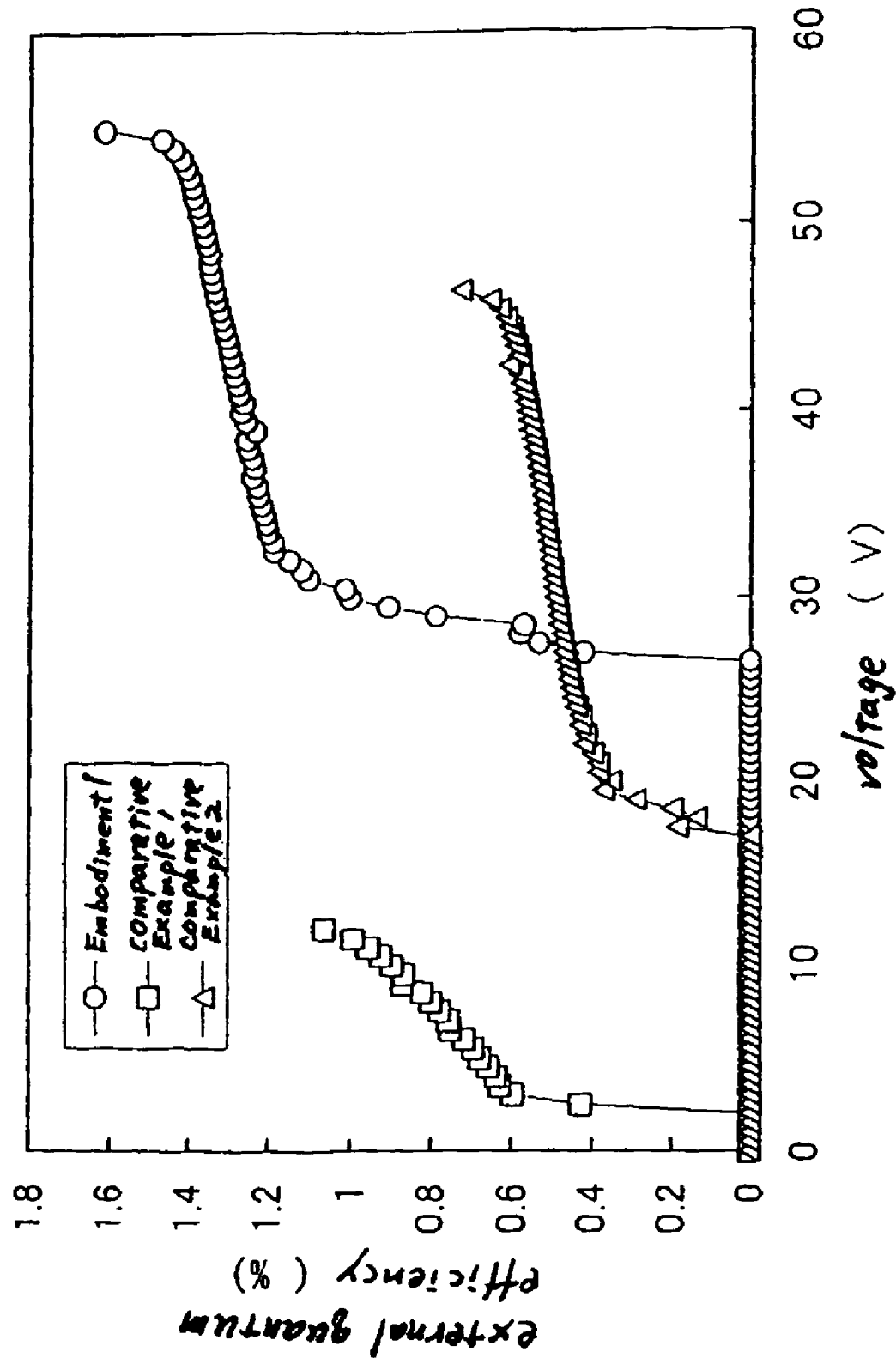

[Fig.6]
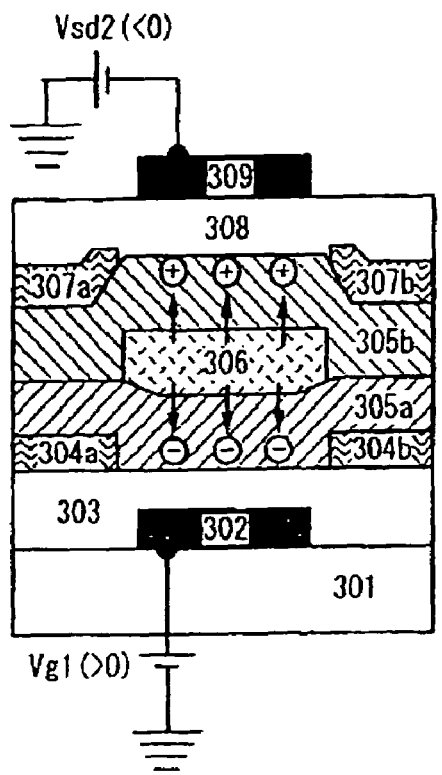
(a)
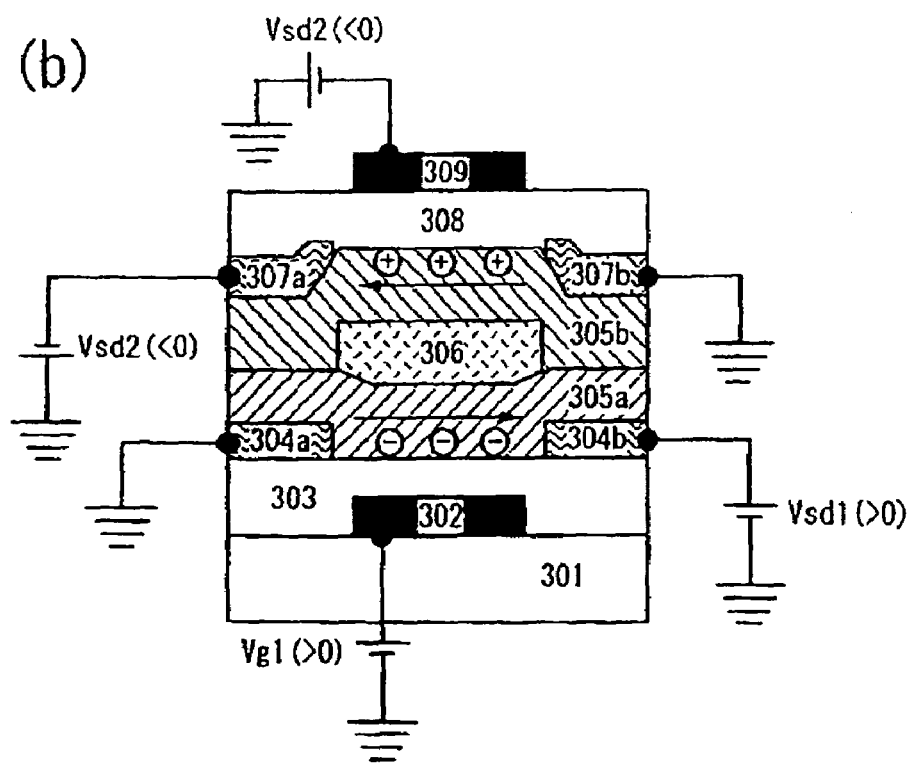
(b)

MIXED METAL AND ORGANIC ELECTRODE FOR ORGANIC DEVICE

TECHNICAL FIELD

The present invention relates to an electrode for an organic device used for an organic device such as an EL element, FET, which use the properties of an organic compound; and to an electronic device having the electrode for the organic device.

BACKGROUND ART

As an organic device, an EL element is widely known. The EL element has an organic compound as a light emitting layer, and current is applied to the light emitting layer by applying voltage by a pair of electrodes provided so as to sandwich the light emitting layer, and photons in accordance with the current density are released; thus, the EL element serves as a light source. In applying voltage to the light emitting layer in an EL element, an alloy of Mg (magnesium) and Ag (silver) or an alloy of Li (lithium) and Al (aluminum), each of the elements has low work function, has been used for a metal electrode of a cathode side in order to lower the electron injection barrier against an organic compound which is regarded as an insulator, and to improve the adhesion with a surface of the light emitting layer.

As to the alloy electrode of Mg or Li, element deterioration due to oxidation of the electrode or the like is caused, and moreover, there are various limitations. Correspondingly, reviewing a metal electrode itself, proposed is an organic element in which a metal doping layer is formed by doping a metal having a work function of 4.2 [eV] or less on a surface of the light emitting layer in contact with a cathode electrode; thus, a layer having an electron supplying properties is provided on the cathode side as a hole injection layer is provided on the cathode side of the light emitting layer (see Patent document 1).

[Patent document 1] Japanese Patent Laid-Open No. 10-270171

In a technique disclosed in the above Patent document 1, the electron injection barrier for the light emitting layer from the cathode side can be lowered by providing the metal doping layer; however, a selection of the materials is limited so that the adhesion between the metal doping layer and the metal electrode is secured; further, the kind of metal is also limited.

In addition, a multiphoton emission (MPE) element having a structure in which a plurality of light emitting layers are connected in sequence is also proposed lately. In order to realize this MPE element, an internal electrode provided between light emitting layers adjacent to each other need to have a function of injecting electrons into one of the light emitting layers and injecting holes into the other light emitting layer. Therefore, the technique disclosed in the above Patent document 1 cannot be applied to the internal electrode for an MPE element.

DISCLOSURE OF THE INVENTION

[Problem to be Solved by the Invention]

It is an object of the invention to provide an electrode for an organic device which can be widely used for organic devices by combining the hole injection function and the electron injection function.

[Means to Solve the Problem]

In order to solve the problem, an electrode for an organic device according to a first invention which is provided in contact with an organic layer (a layer containing an organic compound) of an organic device which is a functional element using the properties of the organic compound is characterized by having a work function of 4.2 [eV] or less and a metal having a work function of more than 4.2 [eV] are mixed with one kind of organic compound at least at a junction surface with the organic layer. As thus formed, the electrode material in which a metal having a work function of 4.2 [eV] or less and a metal having a work function of more than 4.2 [eV] are mixed with the one kind of organic compound is used for at least a portion in contact with the organic layer of an organic device, and an electron injection function derived from the metal having a work function of 4.2 [eV] or less or a hole injection function derived from the metal having a work function of more than 4.2 [eV] is performed in accordance with the polarity of voltage applied to the organic layer. Therefore, the electrode can be used as an electrode of either an anode or a cathode of an organic device and moreover used for an organic device which respectively requires an electron injection function for one organic layer and a hole injection function for the other organic layer as an internal electrode of an MPE element. Further, since one kind of organic compound is used for the electrode material, the adhesion with an organic layer of the organic device is also improved.

In order to solve the problem, an electrode for an organic device according to a second invention which is provided between a first organic layer (a first layer containing an organic compound) and a second organic layer (a second layer containing an organic compound) of an organic device which is a functional element using the properties of the organic compound is characterized by having a first region in which a metal having a work function of 4.2 [eV] or less is mixed with one kind of organic compound and a second region in which a metal having a work function of more than 4.2 [eV] is mixed with the one kind of organic compound, wherein the first region and the second region are respectively in contact with the first organic layer and the second organic layer. As thus formed, the electrode is to be specialized as an internal electrode provided between the first organic layer and the second organic layer. Accordingly, electrons can be injected into the first organic layer with the first region in which a metal having a work function of 4.2 [eV] or less is mixed with one kind of organic compound, and holes can be injected into the second organic layer with the second region in which a metal having a work function of more than 4.2 [eV] is mixed with the one kind of organic compound; thus, the electrode can be used as an internal electrode in which current can seemingly flow from the first region to the second region.

Further, as to the electrode for an organic device according to the first invention or the second invention, a π-conjugated organic compound and further a bipolar organic compound may be used for the one kind of organic compound. When a π-conjugated organic compound is used as one kind of organic compound, charge exchange between the organic compound and the mixed metal is easily caused; thus, injection property of the carriers in the electrode for an organic device is improved. When the bipolar organic compound is used, it is advantageous in carrier movements of both holes and electrons, which contributes to improvements in the drive voltage of the device or the like.

In order to solve the problem, an electrode for an organic device according to a third invention which is provided between a first organic layer and a second organic layer of an organic device which is a functional element using the properties of the organic compound is characterized by having an electron injection electrode layer in which a metal having a work function of 4.2 [eV] or less is mixed with a first organic compound and a hole injection electrode layer in which a metal having a work function of more than 4.2 [eV] is mixed with a second organic compound which is different from the first organic compound, wherein the electron injection electrode layer and the hole injection electrode layer are respectively in contact with the first organic layer and the second organic layer. As thus formed, the electrode is to be specialized as an internal electrode provided between the first organic layer and the second organic layer. Accordingly, electrons can be injected into the first organic layer with the electron injection electrode layer in which a metal having a work function of 4.2 [eV] or less is mixed with the first organic compound, and holes can be injected into the second organic layer with the hole injection electrode layer in which a metal having a work function of more than 4.2 [eV] is mixed with the second organic compound which is different from the first organic compound; thus, the electrode can be used as an internal electrode by which current can seemingly flow from the first organic layer to the second organic layer.

Further, as to the electrode for an organic device according the third invention, an organic compound with high electron injection properties can be used for the first organic compound of the electron injection electrode layer and an organic compound with high hole injection properties can be used for the second organic compound of the hole injection electrode layer. Thus, each of electrons in the electron injection electrode layer and holes in the hole injection electrode layer can move more easily, which contributes to improvements in the drive voltage of the device or the like.

In addition, an electrode for an organic device according to any one of the first through third inventions may be included in an electronic device. As the electronic device, a cellular phone, a personal computer, a monitor, a video camera, a digital camera, a goggle type display, a navigation system, audio components, a car audio system, game machine, a mobile computer, a portable game machine, an electronic book, and an image reproducing device equipped with a recording medium are given.

Effects of the Invention

The electrode for an organic device according to the first invention formed as above uses the electrode material in which a metal having a work function of 4.2 [eV] or less and a metal having a work function of more than 4.2 [eV] are mixed with the one kind of organic compound is used for at least a portion in contact with the organic layer of an organic device, and an electron injection function derived from the metal having a work function of 4.2 [eV] or less or a hole injection function derived from the metal having a work function of more than 4.2 [eV] is performed in accordance with the polarity of voltage applied to the organic layer. Therefore, the electrode can be used as an electrode of either an anode or a cathode of an organic device and moreover used for an organic device which respectively requires an electron injection function for one organic layer and a hole injection function for the other organic layer as an internal electrode of an MPE element. Further, since one kind of organic compound is used for the electrode material, the adhesion with an organic layer of the organic device is also improved.

The electrode for an organic device according to the second invention is specialized as an internal electrode provided between the first organic layer and the second organic layer. Accordingly, electrons can be injected into the first organic layer with the first region in which a metal having a work function of 4.2 [eV] or less is mixed with one kind of organic compound, and holes can be injected into the second organic layer with the second region in which a metal having a work function of more than 4.2 [eV] is mixed with the one kind of organic compound; thus, the electrode can be used as an internal electrode in which current can seemingly flow from the first region to the second region.

The electrode for an organic device according to the third invention is specialized as an internal electrode provided between the first organic layer and the second organic layer. Accordingly, electrons can be injected into the first organic layer with the electron injection electrode layer in which a metal having a work function of 4.2 [eV] or less is mixed with the first organic compound, and holes can be injected into the second organic layer with the hole injection electrode layer in which a metal having a work function of more than 4.2 [eV] is mixed with the second organic compound which is different from the first organic compound; thus, the electrode can be used as an internal electrode by which current can seemingly flow from the first organic layer to the second organic layer.

Further, an electronic device including an electrode for an organic device according to any one of the first through third inventions having the above characteristics.

BEST MODE FOR CARRYING OUT THE INVENTION

Next, embodiment modes of an electrode for an organic device according to the present invention will be described in details referring to the attached drawings.

Embodiment Mode 1

Shown in FIG. 1 is an electrode for an organic device according to Embodiment Mode 1. For example, an electrode structure in FIG. 1(*a*) is that a metal electrode 101 is formed over an organic layer 100 of the organic device with a carrier injection electrode layer 110 interposed therebetween. As to the carrier injection electrode layer 110, an electrode material in which a metal for electron injection 112 (a metal having a work function of 4.2 [eV] or less) and a metal for hole injection 113 (a metal having a work function of more than 4.2 [eV]) are mixed with one kind of organic compound 111 is layered.

The thus formed electrode for an organic device uses the carrier injection electrode layer 110 to be joined to the organic layer 100. Accordingly, an electron injection function derived from the metal for electron injection 112 or a hole injection function derived from the metal for hole injection 113 is performed in accordance with the polarity of the voltage applied to the organic layer 100. Consequently, the electrode can be used as an electrode of either an anode or a cathode of an organic device. In addition, there are advantages that the carrier injection electrode layer 110 has good adhesion with the organic layer 100 and the metal electrode 101 respectively. Note that the carrier injection electrode layer 110 solely may be made to serve as an electrode for an organic device instead of employing an electrode structure in which the metal electrode 101 is separately provided over the carrier injection electrode layer 110. However, it is more economical to form an electrode for contact (here, the metal electrode 101) with a metal such as Al which is inexpensive by making thinner the carrier injection electrode layer 110 containing an organic compound which is comparatively expensive.

The electrode structure of FIG. 1(*b*) is that a carrier injection electrode layer 110 is provided between a first organic layer 100*a* and a second organic layer 100*b*. In this example, the carrier injection electrode layer 110 serves as an internal electrode. As to the thus formed electrode for an organic device, voltage is applied from the side of the first organic layer 100*a* to the side of the second organic layer 100*b*, electrons are supplied from the carrier injection electrode layer 110 to the first organic layer 100*a*, and holes are supplied from the carrier injection electrode layer 110 to the second organic layer 100*b*; accordingly current flows from the first organic layer 100a to the second organic layer 100b. More specifically, the electrode for an organic device including the carrier injection electrode 110 can perform an electron injection function for one organic layer (first organic layer) and has a hole injection function for the other organic layer (second organic layer). Thus, such an electrode can be used as an internal electrode of an MPE element or an organic field-effect transistor, and further expected to be widely used for a variety of organic devices to be developed in the future.

As a metal whose work function is 4.2 [eV] or less, which is used as the metal for electron injection 112 in the carrier injection electrode layer 110, an alkali metal such as lithium or cesium; an alkaline earth metal such as magnesium, calcium, or barium; a rare earth metal such as erbium or ytterbium; or an alloy containing these metal (aluminum alloy, indium alloy) can be given. Meanwhile, as a metal whose work function is more than 4.2 [eV], which is used for the metal for hole injection 113 in the carrier injection layer 110, most of transition metals except for rare earth metals and an alloy thereof can be used, and gold, silver, copper, zinc, iron, cobalt, nickel, and the like are preferable.

Further, an organic compound 111 in the carrier injection electrode 110 is desirably a π-conjugated metal since the organic compound itself is required to have hole or electron transport properties and to exchange charges with a metal. As a-π conjugated organic compound, for example, a low molecular weight compound such as 4,4'-bis [N-(3-methylphenyl)-N phenyl-amino]-biphenyl (abbreviation: TPD), 4,4'-bis [N-(1-naphthyl)-N-phenyl-amino]-biphenyl (abbreviation: α-NPD), 4,4',4''-tris(N,N-diphenyl-amino)-triphenylamine (abbreviation: TDATA); and 4,4',4''-tris [N-(3-methylphenyl)-N-phenyl-amino]-triphenylamine (abbreviation: MTDATA), 2,5-bis(1-naphtyl)-1,3,4-oxadiazole (abbreviation: BND), 2-(4-biphenylyl)-5-(4-tert-butylphenyl)-1,3,4-oxadiazole (abbreviation: PBD), 1,3-bis [5-(p-tert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), bathophenanthroline (abbreviation: BPhen), bathocuproin (abbreviation: BCP), 2,2',2''-(1, 3,5-benzenetriyl)-tris[1-phenyl-1H-benzimidazole] (abbreviation: TPBI), tris(8-quinolinolate) aluminum (abbreviation: Alq$_3$), bis(10-hydroxy-benzo[h]-quinolinate)beryllium (abbreviation: BeBq$_2$), bis(2-methyl-8-quinolinolate)-4-phenylphenolato-aluminum (abbreviation: BAlq), bis[2-(2-hydroxyphenyl)-benzoxazolate]zinc (abbreviation: Zn (Box)$_2$), 4,4'-bis(N-carbazole)biphenyl (abbreviation: CBP), and 9,10-bis(2-naphthyl)anthracene (abbreviation: β-DNA); or a high molecular weight organic compound such as poly (vinyltriphenylamine) (abbreviation: PVT), poly (N-vinylcarbazole (abbreviation: PVK), poly(2,5-dialkoxy-1,4-phenylenevinylene) (abbreviation: RO-PPV), poly(2,5-dialkoxy-1,4-phenylene) (abbreviation: RO-PPP), poly(9,9-dialkylfluorene) (abbreviation: PDAF), or poly[3-alkylthiophene] (abbreviation: PAT) is given. Note that in consideration of flowing both electrons injected from the metal for electron injection 112 and holes injected from the metal for hole injection 113, it is further preferable that the organic layer 100 of the organic device is bipolar.

The formation method of the electrode for an organic device according to this embodiment, especially, the carrier injection electrode layer 110 is not limited in particular, and various known methods can be employed. For example, in the case of using a three source evaporation method, an organic compound to be the organic compound 111, a metal to be the metal for electron injection 112, and a metal to be the metal for hole injection 113 are respectively set in respective boats in one chamber, and each boat is heated in vacuum for the deposition on the surface where the carrier injection electrode layer is formed. Thus, the carrier injection electrode layer 110 in which all of those (an organic compound, a metal having a work function of 4.2 [eV] or less, a metal having a work function of more than 4.2 [eV]) are mixed can be formed. On this occasion, as the ratio of metal and the organic compound, metal/organic compound is preferably 1/10 or more and 50/1 or less. In the case where the ratio of the metal is too low, the function as an electrode is lost. Further, in the case of the ratio of the metal is too high, the adhesion with the organic layer of an organic device is affected. As to the ratio of the metal for electron injection 112 and the metal for the hole injection 113, a molar ratio of 1/10 or more and 10/1 or less is preferable in order to balance the electron injection and the hole injection.

Embodiment Mode 2

Next, Embodiment Mode 2 of an electrode for an organic device according to the invention will be described referring to FIG. 2. The structure of the electrode for an organic device according to Embodiment Mode 2 is that an electrode layer 120 is provided between a first organic layer 100a and a second organic layer 100b. The electrode layer 120 is formed as follows: an electron injection region 120a containing a metal for electron injection 122 (having a work function of 4.2 [eV] or less) is formed on the side of one kind of organic compound 121 in contact with the first organic layer 100a, and a hole injection region 120b containing a metal for hole injection 123 (having a work function of more than 4.2 [eV]) is formed on the side of the one kind of organic compound 121 in contact with the second organic layer 100b.

As to the thus formed electrode for an organic device, when voltage is applied from the side of the first organic layer 100a to the side of the second organic layer 100b, electrons are supplied from the electron injection region 120a (first region) of the electrode layer 120 to the first organic layer 100a; meanwhile, holes are supplied from the hole injection region 120b (second region) to the second organic layer 100b. Thus, current flows from the first organic layer 100a to the second organic layer 100b. Accordingly, the electrode for an organic device formed from the electrode layer 120 can perform an electron injection function for one organic layer and an electron injection function for the other organic layer; thus, the electrode for an organic device can be used for an MPE element or as an internal electrode of an organic field effect transistor, and wide application to various organic devices to be developed in the future can be expected.

The formation method of the electrode layer 120 which is an electrode for an organic device according to Embodiment Mode 2 is not limited in particular, and various known methods can be used. For example, in the case of performing a two source evaporation method twice, an organic compound to be the organic compound 121, a metal to be the metal for electron injection 122 (a metal having a work function of 4.2 [eV] or less), and a metal to be the metal for hole injection 123 (a metal having a work function of more than 4.2 [eV]) are respectively set in respective boats in one chamber. First, the organic compound and the metal having a work function of 4.2 [eV] or less are co-deposited in vacuum; thus, a layer to be the electron injection region 120a is formed. Then, the organic compound and the metal having a work function of more than 4.2 [eV] are co-deposited; thus, a layer to be the hole injection region 120b is formed. Consequently, regions respectively having different functions (the electron injection region 120a and the hole injection region 120b) can be selectively formed in the one kind of organic compound 121.

Note that, as the organic compound in the electrode layer 120, an organic compound which is similar to the organic compound 111 in the above Embodiment Mode 1 can be used. As the metal for electron injection 122 in the electron injection region 120a of the electrode layer 120, a metal which is similar to the metal for electron injection 112 in the above Embodiment Mode 1 can be used. As the metal for hole injection 123 in the hole injection region 120b of the electrode layer 120, a metal which is similar to the metal for hole injection 113 in the above Embodiment Mode 1 can be used. Further, as the ratio of the organic compound and the metal in the electron injection region and the hole injection region, it is preferable that metal/organic compound (molar ratio) is 1/10 or more and 50/1 or less.

Embodiment Mode 3

Next, Embodiment Mode 3 of an electrode for an organic device according to the invention will be described referring to FIG. 3. The structure of electrode for an organic device according to Embodiment Mode 3 is that a laminated electrode 130 is provided between a first organic layer 100a and a second organic layer 100b. The laminated electrode 130 is formed as follows: an electron injection electrode layer 130a in which a metal for electron injection 132 (a metal having a work function of 4.2 [eV] or less) is mixed with an organic compound for electron transport 131a is laminated on the side of the first organic layer 100a, and a hole injection electrode layer 130b in which a metal for hole injection 133 (a metal having a work function of more than 4.2 [eV]) is mixed with an organic compound for hole transport 131b is laminated on the side of the second organic layer 100b.

As to the thus formed electrode for an organic device, when voltage is applied from the side of the first organic layer 100a to the side of the second organic layer 100b, electrons are supplied from the electron injection electrode layer 130a of the laminated electrode layer 130 to the first organic layer 100a; meanwhile, holes are supplied from the hole injection electrode layer 130b to the second organic layer 100b; thus, seemingly, current flows from the first organic layer 100a to the second organic layer 100b. Accordingly, the laminated electrode 130 used as the electrode for an organic device can perform an electron injection function for one organic layer (first organic layer) and a hole injection function for the other organic layer (second organic layer); thus, the electrode for an organic device can be used for an MPE element or as an internal electrode of an organic field effect transistor, and wide application to various organic devices to be developed in the future can be expected.

In addition, as to an electrode for an organic device according to the embodiment mode, an organic compound with high electron transport properties can be used as the organic compound for electron transport 131a (first organic compound) of the electron injection electrode layer 130a, and an organic compound with high hole transport properties can be used as the organic compound for hole transport 131b (second organic compound) of the hole injection electrode layer 130b. Accordingly, unlike in the above Embodiment Modes 1 and 2, there is an advantage that a bipolar organic compound for flowing both electrons injected with the metal for electron injection and holes injected with the metal for hole injection is not necessary.

The formation method of the laminated electrode 130, that is an electrode for an organic device according to Embodiment Mode 3, is not limited in particular, and various known methods can be used. For example, in the case of using a formation method in which two-source evaporation is performed twice, an organic compound A to be the organic compound for electron transport 131a, an organic compound B to be the organic compound for hole transport 131b, a metal to be the metal for electron injection 122 (a metal having a work function of 4.2 [eV] or less), and a metal to be the metal for hole injection 123 (having a work function of more than 4.2 [eV]) are respectively set in respective boats in one chamber. First, the organic compound A and the metal having a work function of 4.2 [eV] or less are co-deposited to form the electron injection electrode layer 130a, and then, the organic compound B and the metal having a work function of more than 4.2 [eV]) are co-deposited to form the hoe injection electrode layer 130b; thus, the laminated electrode can be formed.

In addition, as the organic compound with high electron transport properties which is preferable as the organic compound for electron transport 131a in the electron injection electrode layer 130a, BND, PBD, OXD-7, TAZ, BPhen, BCP, TPBI, Alq$_3$, BeBq$_2$, BAlq, Zn (BOX)$_2$, and the like are given. As the organic compound with high hole transport properties which is preferable as the organic compound for hole transport 131b in the hole injection electrode layer 130b, TPD, α-NPD, TDATA, MTDATA, PVT, PVK, and the like are given. Further, as the metal for electron injection 112 in the electron injection electrode layer 130a of the laminated electrode 130, a metal which is similar to the metal for hole injection 133 in the above Embodiment Mode 1 can be used. As the metal for hole injection 133 in the hole the hole injection electrode layer 130b of the laminated electrode 130, the metal for hole injection 113 in the above Embodiment Mode 1 can be used.

STRUCTURAL EXAMPLE 1 OF ORGANIC DEVICE

Next, as a structural example of an organic device composed using an electrode for an organic device according to each Embodiment Mode above, an example of the application to an organic EL element will be described. The element structure is shown in FIG. 4.

FIG. 4 is a known organic EL element (MPE element) incorporating an electrode for an organic device having both electron injection function and hole injection function (any one according to Embodiment Modes 1 to 3 is applicable), and reference numeral 201 denotes an anode, 202 denotes a cathode, 203a denotes a first electroluminescent layer, 203b denotes a second electroluminescent layer, and 204 denotes a charge generation layer. In addition, the first electroluminescent layer 203a and the second electroluminescent layer 203b are capable of electroluminescence or contain an organic compound which can emit light by carrier injection. Further, the charge generation layer 204 is not connected with an external circuit, and serves as a floating internal electrode.

As to an organic EL element having the above structure, in the case of applying voltage between an anode 201 and a cathode 202, electrons are injected into the first electroluminescent layer 203a from the charge generation layer 204, and holes are injected into the second electroluminescent layer 203b from the charge generation layer 204. Meanwhile, seen from an external circuit, holes are injected into the first electroluminescent layer 203a from the anode 201, and electrons are injected into the second electroluminescent layer 203b from the cathode; thus, carrier recombination occurs both in the first electroluminescent layer 203a and the second electroluminescent layer 203b, which leads to light emission. On this occasion, if current I flows, both the first electroluminescent layer 203a and the second electroluminescent layer 203b can emit photons of the amount corresponding to the current I. Accordingly, as compared with an organic EL element having only one electroluminescent layer, an MPE element has an advantage of emitting twice the amount of light by the same current.

Note that in this structural example, two layers of electroluminescent layers are laminated in a charge generation layer; further, current efficiency can be improved multiple times by laminating more electroluminescent layers (by interposing each charge generation layers between each electroluminescent layers). Theoretically, great enhancement also relating to element lifetime in addition to the improvement in current efficiency is expected. However, as the number of laminated electroluminescent layers is increased, high voltage is required to apply the same current I.

(Embodiment of Organic EL Element)

As the charge generation layer of an organic EL element described above, any one of the electrode structures in Embodiment Modes 1 to 3 can be used. Here, an example of forming an organic element using an electrode for an organic device according to Embodiment Mode 3 will be described. Accordingly, a charge generation layer 204 is formed so that the side of the first electroluminescent layer 203a serves as an electron injection electrode layer 204a and the side of the second electroluminescent layer 203b serves as a hole injection electrode layer 204b.

First, a glass substrate on which ITO to be used as an anode 201 was patterned was washed with boiling ethanol. Further, the substrate surface was washed with an ozone plasma cleaner. The washed substrate and a material to be deposited were set inside a vacuum deposition system, and thereafter the pressure in the chamber was reduced to about $10^{-4}$ Pa.

After the intended degree of vacuum is obtained, first, TPD was deposited in a rate of about 0.2 to 0.4 nm/s to form the film of 70 nm. Subsequently, $Alq_3$ was deposited in a rate of about 0.2 to 0.4 nm/s to form the film of 60 nm. The above become the first electroluminescent layer 203a.

Next, as the deposition rate of Mg was fixed to 0.1 nm/s, $Alq_3$ is also evaporated to co-evaporate Mg and $Alq_3$. At this time, the total deposition rate is controlled to be 0.2 nm/s; therefore, the ratio of Mg and $Alq_3$ is 1:1 by weight (about 19:1 in a molar ratio). Note that the co-deposited layer was formed to 10 nm. Further, as the deposition rate of Au is fixed to 0.1 nm/s, TPD is also evaporated to co-evaporate Au and TPD. At this time, the total deposition rate is controlled to be 0.2 nm/s; therefore, the ratio of Au and TPD is 1:1 by weight (about 2.6:1 in a molar ratio). Note that the co-deposited layer was formed to 10 nm. The total 20 nm of the co-deposited layer is the electrode for an organic device according to the invention, and it serves as the charge generation layer 204.

On the thus formed charge generation layer 204, a second electroluminescent layer 203b in which TPD (70 nm) and $Alq_3$ (60) are laminated is formed as with the first electroluminescent layer 203a. Further, in the like manner as above, Mg and $Alq_3$ are co-deposited to be 1:1 by weight to form 10 nm co-deposited layer. Next, Al was deposited to 80 m in a deposition rate of about 0.2 to 0.4 nm/s to form the cathode 202.

The characteristics of a multiphoton emission element (ITO/TPD (70 nm)/$Alq_3$ (60 nm)/Mg: $Alq_3$ (10 nm)/Au: TPD (10 nm)/TPD (70 mun)/$Alq_3$ (60 nm)/Mg: $Alq_3$ (10 nm)/Al (80 nm)) were shown in FIG. 5. The horizontal axis indicates current density (V), and the vertical axis indicates external quantum efficiency (%: the number of extracted photons/the number of injected carriers). The external quantum efficiency in light emission is about 1.2 to 1.6%.

COMPARATIVE EXAMPLE 1

For comparison, an organic EL element without a charge generation layer, namely with only one electroluminescent layer (ITO/TPD (70 nm)/Alq3 (60 nm)/Mg: $Alq_3$ (10 nm)/Al (80 nm)) was formed. The characteristics were also shown in FIG. 5. The external quantum efficiency in light emission is about 0.6 to 1.1%.

The results show that as to the element shown as the above embodiment, the drive voltage is increased compared with the element in the Comparative Example 1; however, its external quantum efficiency is further more than that of the element in the Comparative Example 1; thus, the element operates as a multiphoton emission element. Accordingly, it was proved that the electrode for an organic device according to the invention served as a charge generation layer, and carriers of both holes and electrons can be injected.

COMPARATIVE EXAMPLE 2

Further, in Comparative Example 2, removing the co-deposited layer of Au and TPD from the device of the above embodiment, and like multiphoton emission elements were formed. Accordingly, the element structure is ITO/TPD (70 nm)/$Alq_3$ (60 nm)/Mg: $Alq_3$ (10 nm)/TPD (70 nm)/$Alq_3$ (60 nm)/Mg: $Alq_3$ (10 nm)/Al (80 nm). In this case, only a layer containing a metal having a work function of 4.2 or less is used for the organic compound as the charge generation layer.

The characteristics of the Comparative Example 2 are also shown in FIG. 5. The drive voltage is increased as compared with the Comparative Example 1; however, the external quantum efficiency is not improved, and the element does not serve as a multiphoton emission element. Accordingly, as in this Comparative Example 2, an electrode which injects both holes and electrodes cannot be obtained by only containing a metal having a small work function.

STRUCTURAL EXAMPLE 2 OF ORGANIC DEVICE

Next, an example of the application to an organic filed effect transistor will be described as a structural example of an organic device composed using an electrode for an organic device according to the each embodiment mode above. The element structure is shown in FIG. 6.

FIG. 6(a) shows an organic field effect transistor incorporating a charge generation layer as an internal electrode, including a substrate 301, a first gate electrode 302, a first gate insulating film 303, a first source electrode 304a, a first drain electrode 304b, an electron transport layer 305a using an organic compound with electron transport properties, a hole transport layer 305b using an organic compound with hole transport properties, a charge generation layer 306, a second drain electrode 307a, a second source electrode 307b, a second gate insulating film 308, and a second gate electrode 309. Note that hereinafter, the electron transport layer 305a and the hole transport layer 305b are collectively referred to as an organic semiconductor layer.

With this structure, when Vg1 (>0) is applied to the first gate electrode 302 and Vg2 (<0) is applied to the second gate electrode 309, as shown in FIG. 3(a), electrons are injected into the electron transport layer 305a and holes are injected into the transport layer 305b from the charge generation layer 306 by field effect. Meanwhile, carriers are not to be injected into the organic semiconductor film from the first gate electrode 302 and the second gate electrode 309 due to the existence of the first gate insulating film 303 and the second gate insulating film 308. Accordingly, electrons are accumulated in the organic semiconductor layer in the vicinity of the surface of the first gate insulating film 303, and holes are accumulated in the vicinity of the surface of the second gate insulating film 308; thus, charge accumulated channel layers for respective electrons and holes are formed.

On this occasion, as shown in FIG. 3(b), Vsd1 (>0) is applied between the first source electrode 304a and the first drain electrode 304b, and Vsd2 (<0) is applied between the second source electrode 307b and the second drain electrode 307a. Then the electrons in the electron accumulated layer in the vicinity of the first gate insulating film 303 and the holes in the hole accumulated layer in the vicinity of the second insulating film 308 make current flow through the each source-drain circuit.

It is considered that the thus obtained organic field effect transistor is practical in rapidly controlling a large amount of current. The charge generation layer 306 is required to have functions to inject holes upward and inject electrons downward. The electrode for an organic device according to Embodiment Mode 1 can be directly used as a charge generation layer 306 irrespective of the polarity. The electrode for an organic device according to Embodiment Mode 2 can be used as a charge generation layer 306 by providing an electron injection region on the side of the electron transport layer 305a and a hole injection region on the side of the hole transport layer 305b. The electrode of organic device according to Embodiment Mode 3 can be used as the charge generation layer 306 by providing an electron injection electrode layer on the side of the electron transport layer 305a and a hole injection electrode layer on the side of the hole transport layer 305b.

BRIEF DESCRIPTION OF THE DRAWINGS

[FIG. 1]
A schematic cross-sectional view of an electrode for an organic device according to Embodiment Mode 1.
[FIG. 2]
A schematic cross-sectional view of an electrode for an organic device according to Embodiment Mode 2.
[FIG. 3]
A schematic cross-sectional view of an electrode for an organic device according to Embodiment Mode 3.
[FIG. 4]
A schematic cross-sectional view of an MPE element using an electrode for an organic device according to the present invention.
[FIG. 5]
A diagram showing the characteristics of an MPE element using an electrode for an organic device according to Embodiment Mode 3.
[FIG. 6]
A schematic cross-sectional view of an organic field effect transistor using an electrode for an organic device according to the present invention.

EXPLANATION OF REFERENCE NUMERALS

100: an organic layer, 100a: a first organic layer, 100b: a second organic layer, 101: a metal electrode, 110: a carrier injection electrode layer, 111: an organic compound, 112: a metal for electron injection, 113: a metal for hole injection, 120: an electrode layer, 120a: an electron injection region, 120b: a hole injection region, 121: an organic compound, 122: a metal for electron injection, 123: a metal for hole injection, 130: a laminated electrode, 130a: an electron injection electrode layer, 130b: a hole injection electrode layer, 131a: an organic compound for electron transport, 131b: an organic compound for hole transport, 132: a metal for electron injection, 133: a metal for hole injection

The invention claimed is:

1. An organic device comprising:
a first organic light emitting layer;
an electrode on the first organic light emitting layer; and
a second organic light emitting layer on the electrode;
wherein the electrode comprises a metal having a work function of 4.2 eV or less, a metal having a work function of more than 4.2 eV, and an organic compound.

2. The organic device according to claim 1,
wherein the organic compound comprises a π-conjugated organic compound.

3. The organic device according to claim 2,
wherein the organic compound comprises a bipolar organic compound.

4. An electronic device comprising the organic device according to claim 1, wherein the electronic device is one selected from the group consisting of a cellular phone, a personal computer, a monitor, a video camera, a digital camera, a goggle type display, a navigation system, audio components, a car audio system, game machine, a mobile computer, a portable game machine, an electronic book, and an image reproducing device equipped with a recording medium.

5. An organic device comprising an electrode provided between a first organic layer and a second organic layer,
wherein the electrode comprises a first region in which a metal having a work function of 4.2 eV or less is mixed with an organic compound and a second region in which a metal having a work function of more than 4.2 eV is mixed with the organic compound; and
wherein the first region and the second region are respectively in contact with the first organic layer and the second organic layer.

6. The organic device according to claim 5, wherein the organic compound comprises a π-conjugated organic compound.

7. An electronic device comprising the organic device according to claim 5, wherein the electronic device is one selected from the group consisting of a cellular phone, a personal computer, a monitor, a video camera, a digital camera, a goggle type display, a navigation system, audio components, a car audio system, game machine, a mobile computer, a portable game machine, an electronic book, and an image reproducing device equipped with a recording medium.

8. An organic device comprising an electrode provided between a first organic layer and a second organic layer,
wherein the electrode comprises an electron injection electrode layer in which a metal having a work function of 4.2 eV or less is mixed with a first organic compound and a hole injection electrode layer in which a metal having a work function of more than 4.2 eV is mixed with a second organic compound which is different from the first organic compound,
wherein the electron injection electrode layer and the hole injection electrode layer are respectively in contact with the first organic layer and the second organic layer.

9. The organic device according to claim 8,
wherein the first organic compound of the electron injection electrode layer comprises an organic compound with high electron injection properties and the second organic compound of the hole injection electrode layer comprises an organic compound with high hole injection properties.

10. An electronic device comprising the organic device according to claim 8, wherein the electronic device is one selected from the group consisting of a cellular phone, a personal computer, a monitor, a video camera, a digital camera, a goggle type display, a navigation system, audio components, a car audio system, game machine, a mobile computer, a portable game machine, an electronic book, and an image reproducing device equipped with a recording medium.

* * * * *